United States Patent [19]

Brooks

[11] Patent Number: 4,801,868
[45] Date of Patent: Jan. 31, 1989

[54] CIRCUIT TRACING APPARATUS AND METHOD

[76] Inventor: Lyman J. Brooks, R.F.D. #1, Box 263, Webster, N.H. 03229

[21] Appl. No.: 73,442

[22] Filed: Jul. 14, 1987

[51] Int. Cl.$^4$ .............................................. G01R 19/00
[52] U.S. Cl. ...................................... 324/66; 324/508; 340/538
[58] Field of Search ............................ 324/66, 508, 133; 379/25; 340/538

[56] References Cited

U.S. PATENT DOCUMENTS

| | | |
|---|---|---|
| 2,976,484 | 3/1961 | McClain .............................. 324/508 |
| 3,334,340 | 8/1967 | McConnell . |
| 3,467,835 | 9/1969 | DeCola . |
| 3,529,216 | 9/1970 | Kolm et al. . |
| 3,826,977 | 7/1974 | Woodworth . |
| 3,829,765 | 8/1974 | Siler . |

*Primary Examiner*—Reinhard J. Eisenzopf
*Assistant Examiner*—Anthony L. Miele
*Attorney, Agent, or Firm*—Woodard, Emhardt, Naughton, Moriarty & McNett

[57] ABSTRACT

An apparatus and method for determining which one of a plurality of circuit breakers in a breaker box controls a given electrical outlet supplied by one of the circuits emanating from the breaker box. A transmitter is plugged into the electrical outlet of interest which imposes a low frequency RF signal on the power line. The transmitter includes an indicator for indicating whether power is present at the outlet of interest. A receiver is plugged into a second electrical outlet near the breaker box, the receiver being configured to detect whether the low frequency RF signal is present at the second outlet, and includes an indicator to indicate whether the signal is present at the second outlet. The receiver also includes an indicator for indicating whether power is present at the second outlet. Each of the circuit breakers are turned off and back on in sequence until the circuit breaker is found which causes the receiver signal indicator to go off, while the receiver power indicator remains on. If no such circuit breaker is found, but a breaker is found which causes both the receiver signal indicator and power indicator to go off, then it is likely that the transmitter and receiver are connected to the same circuit, which can be verified by turning off the latter circuit breaker and verifying that the transmitter power indicator is off.

3 Claims, 3 Drawing Sheets

CIRCUIT TRACING APPARATUS AND METHOD

BACKGROUND OF THE INVENTION

The present invention is generally related to devices and methods for tracing electrical power circuits, or more particularly, for determining which of a plurality of circuit breakers controls a circuit of interest.

It is often desirable to disconnect electrical power to an electrical circuit which supplies a particular electrical outlet. Unfortunately, circuit breaker boxes are not always clearly marked as to which circuit breaker in the box controls the outlet of interest. When the outlet of interest is located remotely from the circuit breaker box, it can be time consuming and laborious for a person working alone to switch off each circuit breaker in succession and return to the location of the outlet of interest each time to determine whether the power has been disconnected.

A common way of reducing the effort involved in tracing a circuit to the controlling circuit breaker is to connect an electrical lamp to the outlet of interest and to watch it as each circuit breaker is switched off. This procedure will only work when the outlet of interest is located such that the lamp can be seen from the site of the circuit breaker box, which is usually not the case.

Another common expedient is to connect a sound emitting device, such as a radio, to the outlet of interest and to listen to it as each circuit breaker is switched off. This procedure will work with more remotely located outlets than will the lamp method described above, but may still not work in noisy environments or where the outlet is located extremely remotely, or sound impeding walls intervene.

Both of the above-described procedures have the common failing that the power-off indicating means is located at the site of the outlet of interest. It would be an improvement over the prior art to provide a power-off indicating means located proximate the circuit breaker box so that one could quickly try each circuit breaker in sequence and obtain an immediate local indication of whether power has been disconnected to the outlet of interest.

SUMMARY OF THE INVENTION

Figure 1:
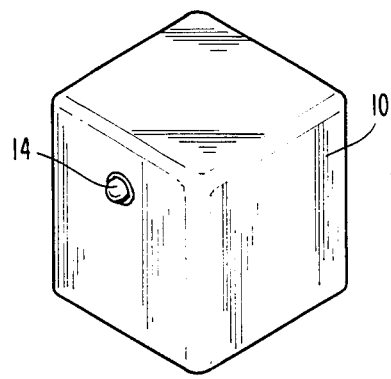
FIG. 1 is a perspective view of one embodiment of a transmitter module of a circuit tracing apparatus made in accordance with the present invention, in which one LED is shown on the front surface thereof.

One aspect of the present invention involves a test set for identifying which one of a plurality of circuit breakers in a circuit breaker box controls a selected electrical outlet of an AC electrical circuit supplied by an AC electrical current distribution system having a plurality of AC electrical circuits, with each electrical circuit controlled by a circuit breaker.

A transmitter module includes electrical connector means for electrically engaging the selected electrical outlet. DC power supply means, having an input and an output, with the input electrically connected to the electrical connector means, is provided for rectifying AC electrical current to DC electrical current, the DC electrical current being available at the output. Electrical power indicating means are provided for indicating to a person whether electrical power is present at the electrical connector means. An oscillator, having an input and an output, with the input electrically connected to the output of the DC power supply means, is provided for generating a low frequency RF signal, the low frequency RF signal being available at the output. Coupler means, having an input and an output, with the input electrically connected to the output of the oscillator and the output electrically connected to the electrical connector means, is provided for coupling the low frequency RF signal from the oscillator to the selected electrical outlet, and hence, to the AC electrical circuit thereof.

A receiver module includes electrical connector means for electrically engaging a second electrical outlet of an AC electrical circuit supplied by the AC electrical current distribution system. DC power supply means, having an input and an output, with the input electrically connected to the electrical connector means, is provided for rectifying AC electrical current to DC electrical current, the DC electrical current being available at the output. Electrical power indicating means is provided for indicating to a person whether electrical power is present at the electrical connector means. Coupler means, having an input and an output, with the input electrically connected to the electrical connector means, is provided for coupling the low frequency RF signal to the output. An amplifier, having a power input, a signal input and a signal output, with the power input electrically connected to the output of the DC power supply means, and the signal input electrically connected to the output of the coupler means, is provided for amplifying the low frequency RF signal, the amplified low frequency RF signal being available at the signal output. A detector, having a power input, a signal input and a signal output, with the power input electrically connected to the output of the DC power supply means, and the signal input electrically connected to the output of the amplifier, is provided for detecting the low frequency RF signal and providing a signal at the output representative of the presence or absence of the low frequency RF signal. Signal indicating means, having an input electrically connected to the output of the detector, is provided for indicating to a person whether the low frequency RF signal is present.

Another aspect of the present invention involves a method for identifying which one of a plurality of circuit breakers in a circuit breaker box controls a selected electrical outlet of an AC electrical circuit supplied by an AC electrical current distribution system having a plurality of AC electrical circuits, with each electrical circuit controlled by a circuit breaker, which method includes the steps of (a) providing a transmitter module having means for electrical connection to the selected electrical outlet, means powered by the selected electrical outlet for generating and coupling a low frequency RF signal to the means for electrical connection, and means powered by the selected electrical outlet for indicating whether AC power is present at the means for electrical connection, (b) connecting the transmitter module to the selected electrical outlet and verifying via the power indicating means that AC power is present at the selected electrical outlet, (c) providing a receiver module having means for electrical connection to a second electrical outlet, means powered by the second electrical outlet for indicating whether the low frequency RF signal of the transmitter module is present at the means for electrical connection, and means powered by the second electrical outlet for indicating whether AC power is present at the means for electrical connection, (d) connecting the receiver module to the second electrical outlet at a location proximate the circuit breaker box such that the indicating means of the receiver module are perceptible by a person operating the circuit breakers, and verifying via the power indicating means that AC power is present at the second electrical outlet, and verifying via the low frequency RF signal indicating means that the low frequency RF signal is present at the second electrical outlet, and (e) sequentially switching off and switching back on each circuit breaker and perceiving the low frequency RF signal indicating means of the receiver module and the power indicating means of the receiver module.

It is an object of the present invention to provide an improved apparatus and method for determining which of a plurality of circuit breakers controls a particular electrical outlet.

Further objects and advantages of the present invention will become apparent from the following descriptions.

DESCRIPTION OF THE PREFERRED EMBODIMENT

For the purpose of promoting an understanding of the present invention, reference will now be made to the embodiment illustrated in the drawings and specific language will be used to describe the same. It is nevertheless to be understood that no limitation of the scope of the invention is thereby intended, the proper scope of the invention being indicated by the claims appended below and the equivalents thereof.

Figure 2:
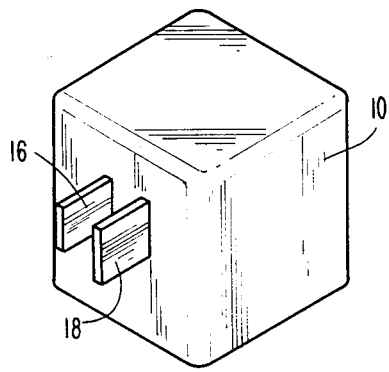
FIG. 2 is another perspective view of the transmitter module of FIG. 1, in which two electrical prongs are shown extending from the rear surface thereof.
Figure 3:
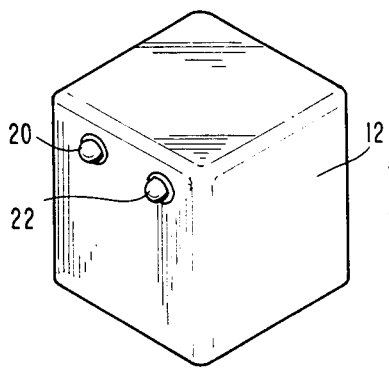
FIG. 3 is a perspective view of one embodimet of a receiver module of a circuit tracing apparatus made in accordance with the present invention, to be used in cooperation with the transmitter module of FIG. 1, in which two LED's are shown on the front surface thereof. The rear surface of the receiver module appears substantially like the rear surface of the transmitter module as shown in FIG. 2.

Referring in particular to FIGS. 1 and 2, there is illustrated a transmitter module 10 and a receiver module 12 in accordance with the present invention.

In the embodiment shown, transmitter module 10 is a cube-shaped enclosure having a red LED 14 mounted to the front surface thereof and visible from the exterior of the module, and having a pair of standard 117V AC prongs 16 and 18 protruding from the rear surface thereof and insertable into a standard AC electrical outlet. Red LED 14 of transmitter module 10 is lighted and remains lit when transmitter module 10 is plugged into an AC outlet, so long as electrical power is present at the outlet. When plugged in, transmitter module 10 imposes a 200 kHz signal upon the power line serving the outlet, so long as electrical power is present at the outlet.

In the embodiment shown, receiver module 12 is a cube-shaped enclosure having a red LED 20 mounted to the front surface thereof and visible from the exterior of the module, and having a pair of standard 117V AC prongs, similar to prongs 16 and 18 of transmitter module 10 (designated below as 16' and 18'), protruding from the rear surface thereof and insertable into a standard AC electrical outlet. Red LED 20 of receiver module 12 is lighted and remains lit when receiver module 12 is plugged into an AC outlet, so long as electrical power is present at the outlet. When plugged in, receiver module 12 detects the presence of a 200 kHz signal upon the power line serving the outlet, if such a signal is present, so long as electrical power is also present at the outlet. The presence of a 200 kHz signal on the power line is indicated by green LED 22, which is lighted and reamins lit so long as a 200 kHz signal and electrical power are present at the outlet into which receiver module 12 is plugged.

Figure 4:
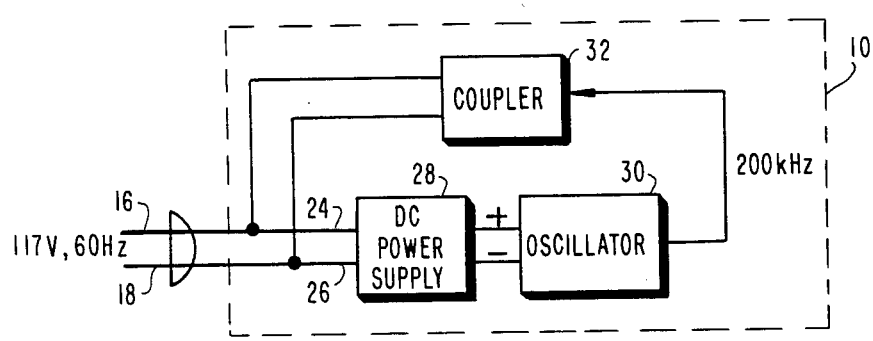
FIG. 4 is a block diagram of the transmitter module of FIG. 1.
Figure 5:
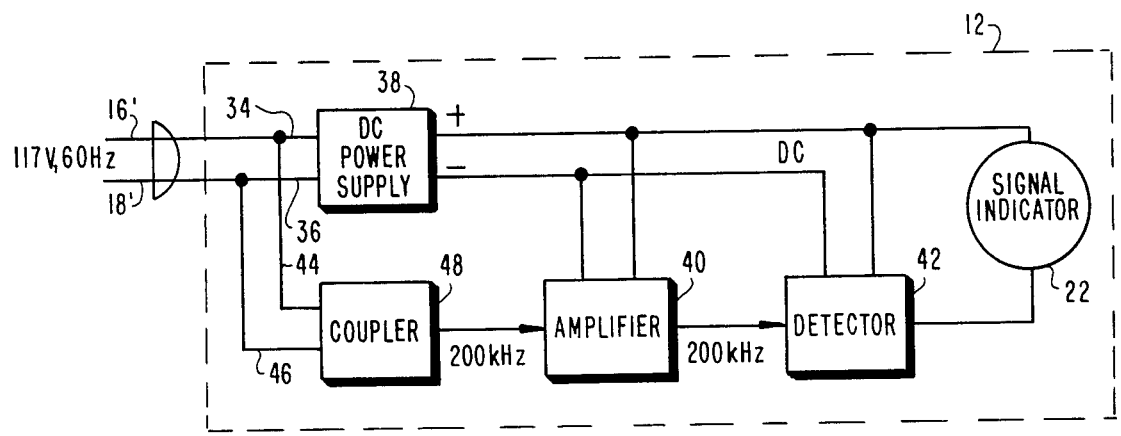
FIG. 5 is a block diagram the the receiver module of FIG. 3.

Referring more particularly to FIGS. 4 and 5, there is illustrated in block diagram form the principle components of transmitter 10 (FIG. 4) and receiver 12 (FIG. 5).

Transmitter 10 includes prongs 16 and 18, referred to above, for connection to a source of household electrical power, typically 117V, 60 Hz AC. In the embodiment described herein, for the sake of ease of description, prong 16 is considered to be connected to the "hot" wire and prong 18 is considered to be connected to the "neutral" wire, although the module will in fact operate with the polarity reversed. Prongs 16 and 18 are connected via conductors 24 and 26 to DC power supply 28 which rectifies, drops the voltage, and filters the 117V, 60 Hz AC power source to provide a DC output at about 25V. Power indicator 14 (not shown in FIG. 4) is powered by DC power supply 28. DC supply 28 is electrically connected to and powers oscillator 30, which generates a low frequency RF signal output having a frequency of about 200 kHz. The 200 kHz signal output from oscillator 30 is impressed upon conductors 24 and 26 via coupler 32, thereby introducing a 200 kHz signal upon the power lines to which prongs 16 and 18 are connected.

Receiver 12 includes prongs 16' and 18', referred to above, for connection to a source of household electrical power, typically 117V, 60 Hz AC. As per the convention adopted above, prong 16' is considered to be connected to the "hot" wire and prong 18' is considered to be connected to the "neutral" wire, although this module will also operate with the polarity reversed. Prongs 16' and 18' are connected via conductors 34 and 36 to DC power supply 38 which rectifies, drops the voltage, and filters the 117V. 60 Hz AC power source to provide a DC output at about 7.5V. Power indicator 20 (not shown in FIG. 5) is powered by DC power supply 38. DC supply 38 is electrically connected to and powers amplifier 40, detector 42 and signal indicator 22 (green LED). Prongs 16' and 18' are also connected via conductors 44 and 46 to coupler 48, which includes a band-pass tuned circuit tuned to about 200 kHz. Thus, should a 200 kHz signal be present upon the power lines to which prongs 16' and 18' are connected, such 200 kHz signal will pass through coupler 48 to amplifier 40, where the signal level is boosted and passed on to detector 42, which includes a phase-locked-loop type detector which locks onto the 200 kHz signal, and causes signal indicator 22 (green LED) to be lighted, thereby indicating the presence of a 200 kHz signal on the power lines to which receiver module 12 is connected.

Figure 6:
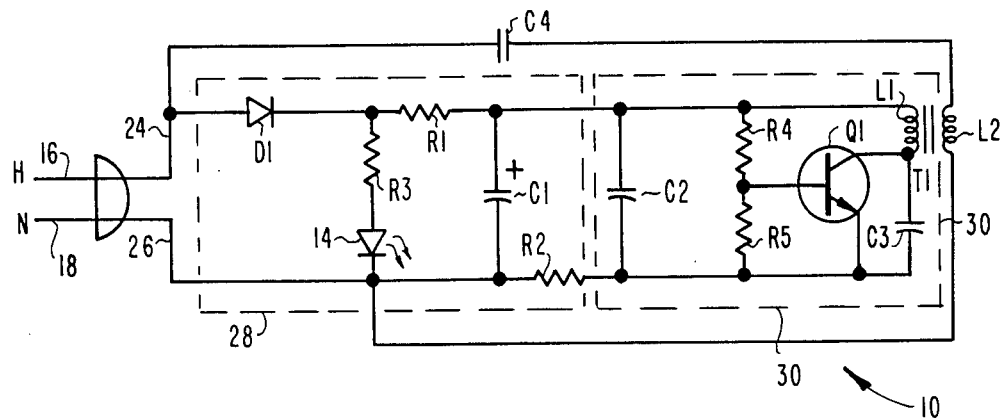
FIG. 6 is a detailed schematic diagram of the transmitter module of FIG. 1.
Figure 7:
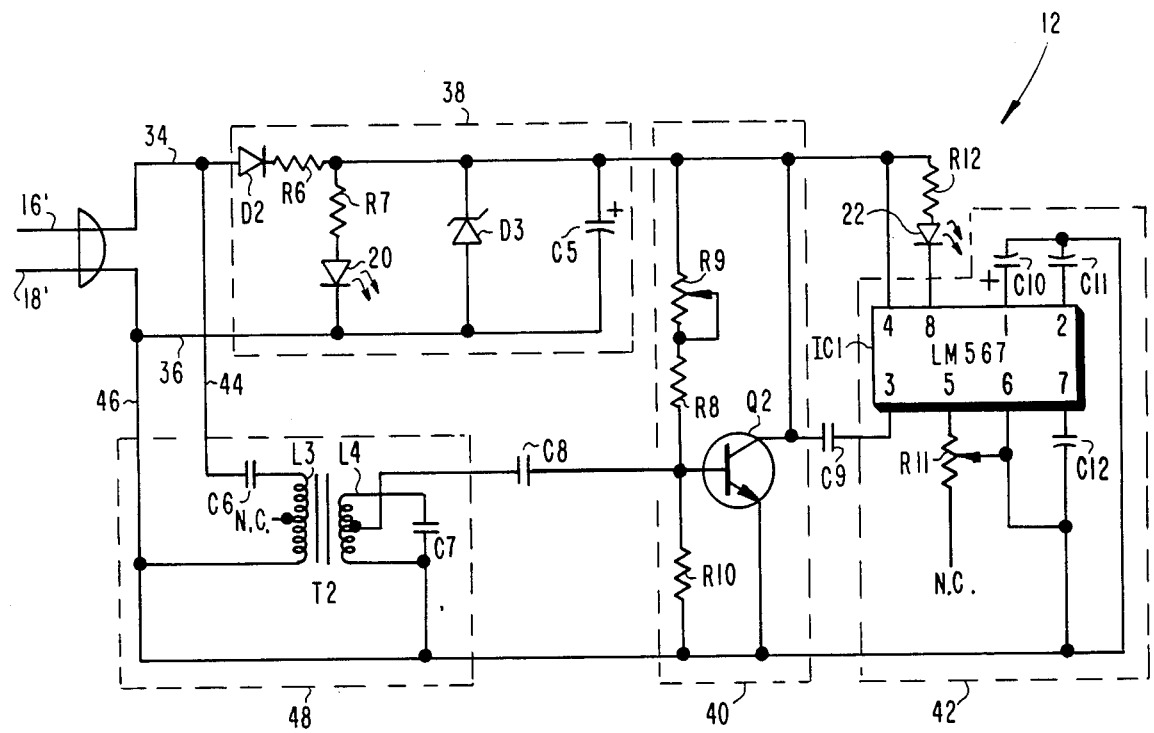
FIG. 7 is detailed schematic diagram of the receiver module of FIG. 3.

Referring to FIGS. 6 and 7, a detailed schematic diagram of transmitter 10 and receiver 12 is illustrated.

Transmitter 10 includes a DC power supply 28 including a half-wave rectifier diode D1 followed by a series-connected voltage-dropping resistor R1, and a parallel-conneted electrolytic filter capacitor C1. Resistor R2 provides DC current limiting for the following oscillator stage 30. Resistor R3 limits current to red LED 14 which is connected across the DC supply to provide a "power present" indicator. Oscillator 30 includes an NPN transistor Q1 connected in a common-emitter configuration and DC biased by resistors R4 and R5, with capacitor C2 providing RF bypass. The frequency of oscillation of transistor Q1 is determined principally by L1 and C3, which in the present embodiment are selected to provide a frequency of oscillation of about 200 kHz. L1 and L2 are the primary and secondary, respectively, of a transformer T1, with L2 serving to couple the 200 kHz signal output of transistor Q1 back to the power supply lines 24 and 26, and thence to prongs 16 and 18. Capacitor C4 is selected to pass the 200 kHz signal while blocking 60 Hz AC power, thereby preventing the secondary L2 of transformer T1 from being burned out by connection across the power supply lines.

Receiver 12 includes a DC power supply 38 including a half-wave rectifier diode D1 followed by a series-connected voltage-dropping resistor R6, and a parallel-connected electrolytic filter capacitor C5. A 7.5V zener diode D3 regulates the voltage output of power supply 38. Resistor R7 limits current to red LED 20 which is connected across the DC supply to provide a "power present" indicator. DC supply 38 provides a regulated 7.5 volts to power amplifier 40, detector 42 and "signal present" indicator 22. Connected to power lines 34 and 36 via lines 44 and 46 is the primary L3 of an IF transformer T2. Capacitor C6 in line 44 is selected to pass a 200 kHz signal while blocking 60 Hz AC power, thereby preventing the primary L3 of transformer T2 from being burned out by connection across the power supply lines. The secondary L4 is parallel tuned with capacitor C7 to resonate at about 200 kHz, thereby providing a band-pass filter function. The center tap of L4 is capacitively coupled via DC blocking capacitor C8 to the base of NPN transistor Q2, connected in a common-emitter configuration and DC biased by resistor R8 and trimmer resistor R9, and by resistor R10. Transistor Q2 amplifies the output signal from coupler 48, and the output from transistor Q2 is capacitively coupled via DC blocking capacitor C9 to the input (pin 3) of integrated circuit IC1, which is an LM 567 phase-locked-loop tone decoder. Capacitors C10, C11, and C12, and resistor R11 are connected to pins 1, 2, 7, 6 and 5, respectively, of IC1 to set the center frequency and bandwidth of IC1. The center frequency as set is nominally 200 kHz. Voltage is supplied to IC1 via pin 4. When a signal within the bandwidth of IC1 as configured is present at input pin 3, IC1 locks on to the signal and pin 8 goes low, thereby grounding "signal present" indicator 22 (green LED), which is connected to DC supply 38 via current limiting resistor R12, and causing LED 22 to be lighted and remain lit so long as a signal of about 200 kHz is present at the input to IC1.

The preferred method of use of the transmitter and receiver modules described above is for tracing 117 volt AC power lines which emanate from a circuit breaker box supplied by a common transformer. By appropriate connection and placement of the transmitter and receiver modules, a single person can quickly and with little labor determine which circuit breaker controls a particular electrical outlet. As used herein, "circuit breaker" can refer to a fuse or other suitable switch for disconnecting a circuit from the main electrical current distribution system.

With all of the circuit breakers turned on at the breaker box, the transmitter module 10 is plugged into the electrical outlet for which the controlling circuit breaker is unknown. The red LED 14 of transmitter module 10 should be lighted, indicating the presence of power at the outlet of interest. If power is not present, either the circuit breaker for that circuit is open, or there is some kind of wiring problem. Assuming that red LED 14 does light, the next step is to plug the receiver module 12 into any convenient electrical outlet near the breaker box which is within sight of a person operating the circuit breaker switches. Both the red LED 20 and the green LED 22 of the receiver module 12 should be lighted, the red LED indicating that there is power at the outlet into which the receiver module 12 is plugged, and the green LED indicating that the 200 kHz signal from the transmitter module 10 is present on the power line supplying receiver module 12. If both the red and green LEDS are off, then either the circuit breaker for the circuit supplying the receiver module's outlet is open, or there is some kind of wiring problem. If the red LED is on, but the green LED is off, then the receiver module 12 and transmitter module 10 are not connected to circuits supplied from a common transformer winding. It should be noted at this point that the transmitter module 10 and receiver module 12 need not be connected to the same circuit for the method to work, they need only be connected via a common winding of a transformer. Hence, the 200 kHz signal impressed upon the wiring by transmitter module 10 will be present in every live circuit supplied by a common transformer winding, which would almost always be the case in household wiring systems, and in many industrial wiring systems.

The tracing process is carried out by sequentially switching off each of the circuit breaker switches at the breaker box and observing the LEDS of the receiver module 12 as each circuit breaker is opened. IF both the red and green LED's on receiver module 12 remain lit, then the circuit breaker just opened is not the one controlling the circuit supplying power to transmitter module 10, and hence that circuit breaker should be closed again and the next circuit breaker opened. This process is repeated until the green LED on receiver module 12 goes out, with the red LED of receiver module 12 remaining lit, which indicates that the circuit supplying power to transmitter module 10 has been opened, and the controlling circuit breaker for the outlet in question has been found.

It should be noted that during the tracing process, it may happen that both the red and green LEDS of receiver module 12 will go out upon opening a circuit breaker. This indicates that the circuit supplying power to receiver module 12 has been opened, and thus it is indeterminate whether transmitter module 10 is still transmitting. In this event, the preferred course of action is to close the circuit breaker again, restoring power to receiver module 12, and to continue with the sequential opening and closing of the remaining circuit breakers until either the circuit breaker is found which causes the green LED of receiver module 12 to go off, while the red LED remains lit, or until all circuit breakers have been exhausted. In the latter case, where all circuit breakers have been tried and the only one which turns off the green LED of receiver module 12 also turns off the red LED thereof, then it is likely that transmitter module 10 and receiver module 12 are coincidentally connected to the same circuit. This can be confirmed by turning off the circuit breaker in question and returning to the site of transmitter module 10 and finding that the red LED 14 of transmitter module 10 is off. Since it is relatively unlikely that transmitter module 10 and receiver module 12 would be plugged into the same circuit, time and labor is saved by not returning to the site of transmitter module 10 to observe the power indicating red LED 14, except as the last step in the tracing process, since this step will be obviated if transmitter module 10 and receiver module 12 are not connected to a circuit controlled by the same circuit breaker, which is the usual case.

While the preferred embodiment of the invention has been illustrated and described in some detail in the drawings and foregoing description, it is to be understood that this description is made only by way of example to set forth the best mode contemplated of carrying out the invention and not as a limitation to the scope of the invention which is pointed out in the claims below.

What is claimed is:

1. A method for identifying which one of a plurality of circuit breakers in a circuit breaker box controls a selected electrical outlet of an AC electrical circuit supplied by an AC electrical current distribution system having a plurality of AC electrical circuits, with each electrical circuit controlled by a circuit breaker, comprising the steps of:
    (a) providing a transmitter module having means for electrical connection to the selected electrical outlet, means powered by the selected electrical outlet for generating and coupling a low frequency RF signal to the means for electrical connection, and means powered by the selected electrical outlet for indicating whether AC power is present at the means for electrical connection;
    (b) connecting said transmitter module to the selected electrical outlet and verifying via said power indicating means that AC power is present at the selected electrical outlet;
    (c) providing a receiver module having means for electrical connection to a second electrical outlet, means powered by the second electrical outlet for indicating whether the low frequency RF signal of the transmitter module is present at the means for electrical connection, and means powered by the second electrical outlet for indicating whether AC power is present at the means for electrical connection;
    (d) connecting said receiver module to the second electrical outlet at a location proximate the circuit breaker box such that the indicating means of said receiver module are perceptible by a person operating the circuit breakers, and verifying via the power indicating means that AC power is present at the second electrical outlet, and verifying via the low frequency RF signal indicating means that the low frequency RF signal is present at the second electrical outlet;
    (e) sequentially switching off and switching back on each circuit breaker and perceiving the low frequency RF signal indicating means of the receiver module and the power indicating means of the receiver module.

2. The method of claim 1, in which step (e) includes discerning which one of two alternate events occurs, the first event being that when a circuit breaker is switched off, the low frequency RF signal indicating means of the receiver module gives a negative indication and the power indicating means of the receiver module gives a positive indication, the second event being that all circuit breakers have been exhausted without the occurrence of the first event, but when a circuit breaker is switched off, the low frequency RF signal indicating means of the receiver module gives a negative indication and the power indicating means of the receiver module also gives a negative indication.

3. The method of claim 2, in which step (e) further includes switching off any circuit breaker which caused the second event to occur, and perceiving the power indicating means of the transmitter module to verify that it is giving a negative indication.

* * * * *